United States Patent
Stolpman et al.

(10) Patent No.: US 6,608,531 B2
(45) Date of Patent: Aug. 19, 2003

(54) TEMPERATURE COMPENSATED CRYSTAL OSCILLATOR PACKAGE

(75) Inventors: James L. Stolpman, Bloomingdale, IL (US); Mark D. Schrepferman, Palatine, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/001,353

(22) Filed: Oct. 31, 2001

(65) Prior Publication Data
US 2002/0050869 A1 May 2, 2002

Related U.S. Application Data
(60) Provisional application No. 60/244,530, filed on Oct. 31, 2000.

(51) Int. Cl.[7] .............................. H03L 1/00; H03B 5/36
(52) U.S. Cl. ............... 331/176; 331/108 D; 331/116 R; 331/158; 257/416; 257/522; 257/629; 257/678
(58) Field of Search ..................... 331/66, 68, 69, 331/70, 108 C, 108 D, 116 R, 116 FE, 158, 176; 257/414–416, 522, 629, 678, 680, 690, 700, 737, 738

(56) References Cited

U.S. PATENT DOCUMENTS

| | | | |
|---|---|---|---|
| 5,260,596 A | * 11/1993 | Dunn et al. | 257/414 |
| 5,405,476 A | 4/1995 | Knecht | |
| 5,446,954 A | 9/1995 | Knecht et al. | |
| 6,229,249 B1 | 5/2001 | Hatanaka et al. | |
| 6,229,404 B1 | 5/2001 | Hatanaka | |
| 6,239,669 B1 | 5/2001 | Koriyama et al. | |
| 6,304,151 B1 | 10/2001 | Uehara et al. | |

FOREIGN PATENT DOCUMENTS

| | | |
|---|---|---|
| EP | 0 724 334 B1 | 3/1999 |
| JP | 54-118993 | 9/1979 |
| JP | 57-200370 | 11/1982 |

* cited by examiner

Primary Examiner—David C. Mis
(74) Attorney, Agent, or Firm—Darleen J. Stockley; Joseph Krause

(57) ABSTRACT

An improved temperature compensated quartz oscillator, which includes a package for mounting compensating circuitry over a cavity instead of on a planar layer, reduces the chip failure rate by preventing undesired contact of the compensation circuitry with the material forming the layer upon which the circuitry is mounted.

20 Claims, 4 Drawing Sheets

TEMPERATURE COMPENSATED CRYSTAL OSCILLATOR PACKAGE

CROSS-REFERENCED TO RELATED APPLICATION

This application claims the benefit of the filing date of U.S. Provisional Application, Ser. No. 60/244,530, filed on Oct. 31, 2000.

BACKGROUND OF THE INVENTION

1. Technical Field

This invention pertains generally to crystal regulated oscillators, and more specifically to crystal oscillator packaging.

2. Background

An oscillator circuit provides a stable-frequency output signal (typically sinusoidal) and, as those skilled in the electronics art will recognize, is an essential component for a variety of electronic devices that include communications equipment, navigation systems and data processing equipment. Many oscillators employ a piezoelectric quartz crystal as a mechanism for generating and maintaining a stable output signal. Quartz crystal ingots are grown and then sawn at different angles to produce crystals having different operating characteristics.

Quartz crystal resonant frequencies are temperature dependent. Stated alternatively, the output frequency of quartz crystals experience frequency shifts that are caused by temperature changes in the quartz element. When used in an oscillator circuit, the quartz crystal can cause the oscillator output frequency to shift as the quartz crystal's temperature changes. The output signal of a quartz crystal oscillator can be kept steady over temperature by using circuits that sense temperature and which generate an appropriate corrective signal, which keeps the oscillator output frequency stable. Such a circuit is known as a temperature compensated crystal oscillator or "TCXO." A TCXO is a quartz oscillator that employs active circuitry to generate a compensation signal that is used to keep the output of the oscillator device stable over wide-ranging temperatures. A TCXO can provide a very stable output signal over wide temperature swings and is a preferred oscillator in many communications applications and is the oscillator of choice where highly stable frequency sources are required. As with all electronic components, however, TCXOs have become increasingly smaller. It is now known to package the quartz crystal in the same package as the compensation and oscillator circuitry, which is typically embodied as an integrated circuit. The footprint of a TCXO can be significantly reduced if the TCXO is fabricated in a multi-layer housing wherein an IC is mounted and electronically coupled to the quartz crystal resonator.

A prior art methodology for reducing the footprint of a TCXO includes using a multi-layer housing that contains a quartz crystal resonator on one layer, and mounts the active electronic oscillator/compensation circuitry on another layer. Directly mounting an IC on a ceramic layer has been proven to be somewhat problematic when the package is constructed with cavities on both the top and bottom of the package. The relative non-planarity of a ceramic IC carrier layer can be so significant such that an integrated circuit, which is highly planar and which needs to be mechanically bonded to the ceramic carrier layer, can be damaged during the course of bonding an IC to the ceramic carrier layer.

An improved TCXO that avoids the manufacturability problems associated with multi-layered, multi-cavity ceramic housings, and in particular the tendency of integrated circuit devices to fracture or otherwise fail upon mounting to a ceramic carrier layer, would be an improvement over the prior art.

SUMMARY

There is provided a TCXO that includes a multi-layer housing in which an integrated circuit (providing active circuitry for oscillation and to compensate for temperature variations in a quartz resonator) is mounted on a layer having an evacuated region which allows contact pads on the IC to mechanically couple to and mate with corresponding pads on the carrier surface such that the IC substrate does not directly contact the carrier surface.

DETAILED DESCRIPTION OF PREFERRED EMBODIMENTS

Figure 1:
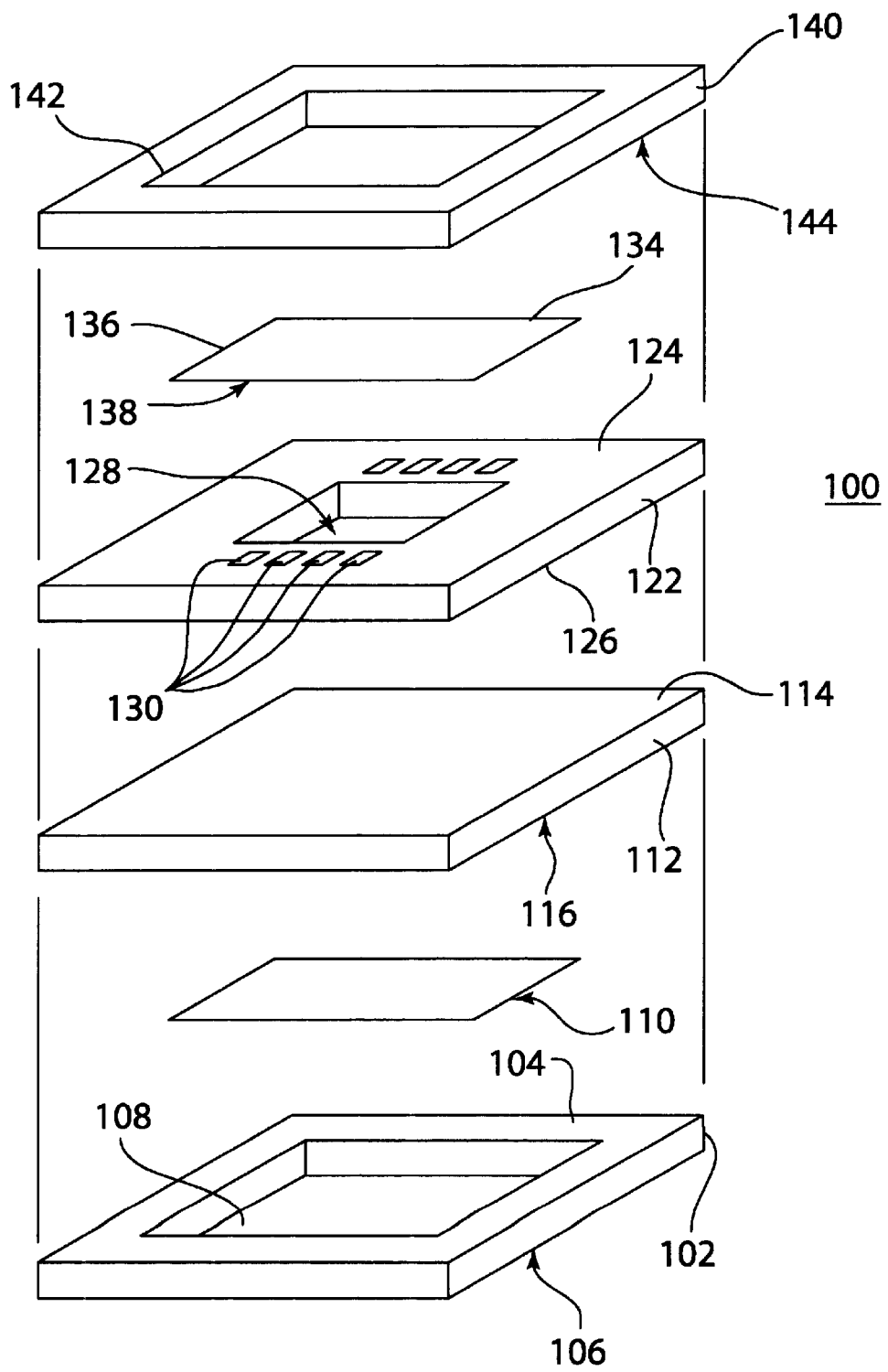
FIG. 1 shows a simplified isometric view of a multi-layer TCXO including the improved ceramic carrier layer reducing breakage of an included integrated circuit.

FIG. 1 shows a simplified isometric view of a multi-layer TCXO 100, the layers of which in the preferred embodiment, are ceramic. Alternate embodiments would include layers formed using thermoplastic, metal or glass materials as well.

A first ceramic layer 102 has a first, or top side 104 as well as a second, or bottom side 106 and includes a cavity 108 that extends through the layer 102. The crystal resonator 110 is used together with the integrated circuit to generate a relatively frequency stable output signal, the temperature dependence of which is compensated for by the compensation portion of the IC which is mounted elsewhere in the packaging of the TCXO 100.

Immediately "above" the crystal cavity layer 102 is a base ceramic layer, which provides a seal to the crystal cavity and on which connecting traces may be placed to connect the crystal to the integrated circuit. The crystal is mounted on one surface 116 of this layer of ceramic 112. The other surface 114 of this ceramic layer 112 may be utilized to mount discrete capacitors that perform various functions such as noise reduction or to perform a DC block.

In an assembled TCXO package, the ceramic crystal-mounting layer 112 is coupled to and mounts directly on top of the crystal cavity layer 102 such that the second surface 116 of the cavity layer 112 is electrically and mechanically in contact with the top or first layer 104 of the crystal cavity layer 102.

Immediately above the crystal-mounting layer 112, there is an integrated circuit carrier layer 122. The integrated circuit carrier layer ("carrier layer") 122 has a top or first side 124 as well as a bottom or second side 126 as shown. In the preferred embodiment, the IC 134 includes contact areas or pads on the bottom side 138 that will electrically connect to corresponding mounting pads 130 located on the top side 124 of carrier layer 122 via mounting bumps. The mounting bumps are typically low-profile elevations of approximately ¹⁄₁₀₀₀ of an inch of various material that are placed on either the areas or pad of the IC 134 or on the pads 130 on top surface 124 of carrier layer 122 that provide an electronic pathway between the housing and an integrated circuit 134 mounted to the cavity layer 122.

Integrated circuit 134, which has a top or first side 138 and a bottom or second side 136, is shown mounted in an "inverted" position, i.e., with the inter-connecting side facing the bottom or lower edge of the plane of the page on which FIG. 1 is depicted. When the integrated circuit 134 is mounted over the cavity as shown in FIG. 1, variations in the planarity of the first or upper surface 124 of the carrier layer 122 are significantly less likely to cause the integrated circuit to be damaged when the IC is mechanically bonded to the carrier layer. The height of the mounting bumps (whether they are located on the surface 124 or on the IC 134 or both) is sufficient to "reach" above height variations in the carrier layer's upper surface 124 that are caused by the ceramic package construction and curing process and the resulting non-planarity (curvature) of the cured ceramic surface 124. (Not separately shown on the integrated circuit 134 are surface contact bumps on the IC's top side 138 which mate with and are bonded to the gold mounting pads 130 in an ultrasonic welding process.)

Prior art packages which do not include the cavity 128 require the first surface 124 of the carrier layer 122 to be nearly perfectly planar in order to avoid breakage of or damage to the integrated circuit 134 which is caused by surface elevation differences of the carrier layer 122. By suspending the integrated circuit 134 partially over cavity 128, the integrated circuit contact pads can, by their height, provide surface "protuberances" to which the integrated circuit 134 can be bonded without breakage.

Immediately "above" the circuit carrier layer 122 is a layer 140 also having a top or first side 142 as well as a bottom side 144, which forms a cavity around the integrated circuit and any other components mounted on the top surface of the carrier layer 122.

When the layers shown in FIG. 1 are fully assembled together, they provide a compact package for a temperature compensated quartz oscillator which provides enhanced manufacturability by virtue of reduced breakage of the integrated circuit 134 mounted above the cavity 128.

The orientation of the IC "up" or "down" is relative, and that an equivalent embodiment would include any other order of the ceramic layers 102, 112, 122. For example, the crystal cavity layer 102 might be positioned "above" or "on top of" the IC carrier layer 122. Similarly, the carrier layer 122 might have the crystal cavity formed therein such that the IC mounts into the cavity with the cavity facing "downward" and the circuitry of the IC facing 10 "upward."

The carrier layer's cavity extends at least partially through the carrier layer 122. Alternate embodiments would include carrier layers 122 in which the cavity 128 extends through the upper surface 124 as well as completely through the layer 122 including it's bottom surface 126; i.e., the cavity extends all the way through the carrier layer 122.

Figure 2:
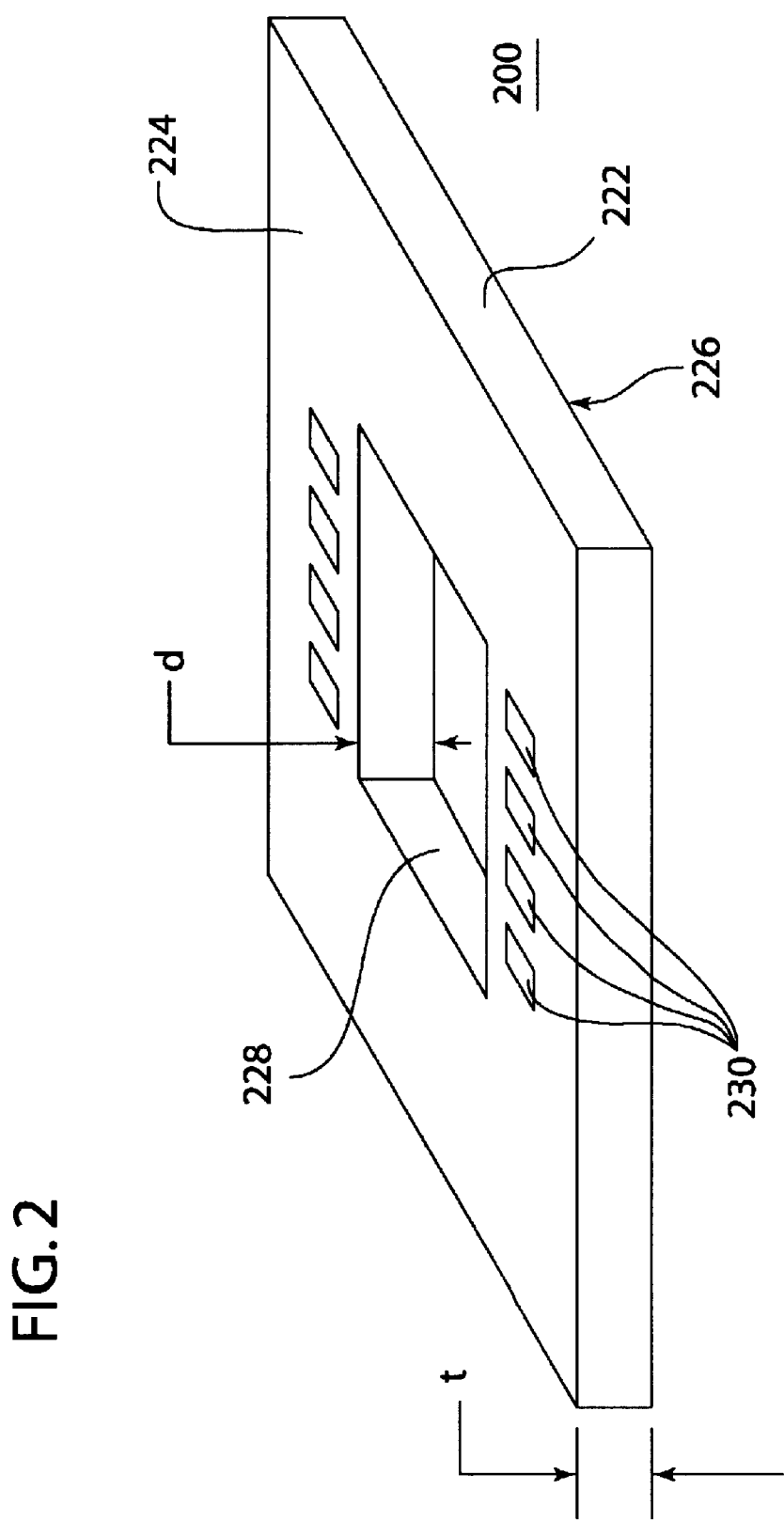
FIG. 2 shows an enhanced view of the trip carrier layer shown in FIG. 1.

FIG. 2 is an enlarged schematic view of an exemplary carrier layer 222 such as the one, 122, shown in FIG. 1. In FIG. 2, the top or upper surface 224 or the carrier layer 200 includes a number of contact bonding pads 230. The bottom surface is identified with reference numeral 226. The cavity 228 is shown having a depth "d" that is substantially equal to the carrier layer thickness "t." Alternate embodiments include carrier layers 200 that are thicker than the depth of the cavity providing a carrier layer that has an opening through only the upper surface.

Figure 3:
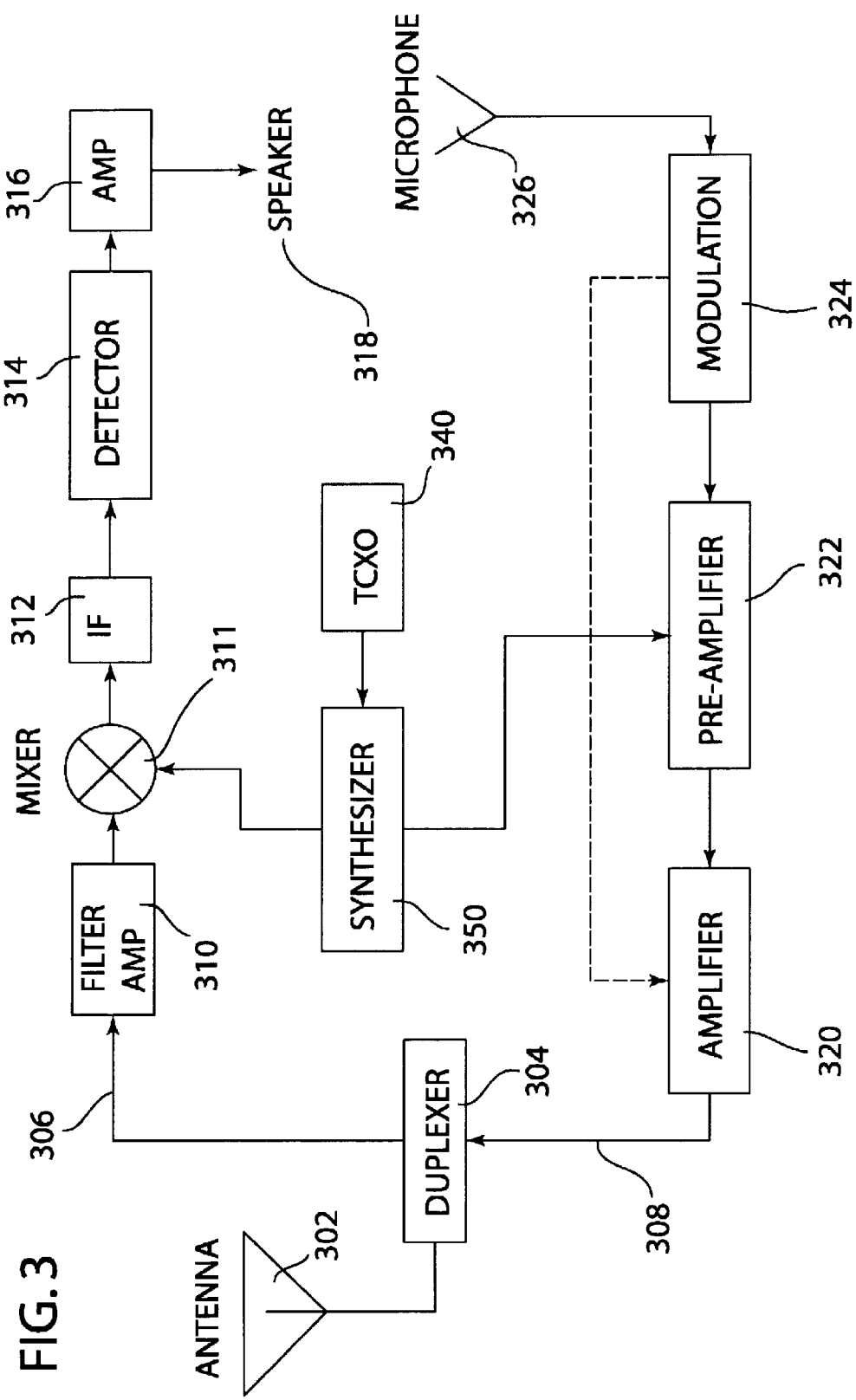
FIG. 3 shows a simplified block diagram of a communications device employing a TCXO as shown in FIG. 1.

FIG. 3 shows a simplified block diagram of a wireless communications device, which might include a cellular telephone system base station, two-way radio system base station, cellular phone, cordless telephone, or other radio communications device, which would use the TCXO shown in FIG. 1.

In FIG. 3, an antenna 302 is coupled to a duplexer 304. The duplexer 304 allows signals from a transmitter 308, which are at one frequency, to use the same antenna 302 as the receiver portions of the phone, the signals for which are at a second frequency.

Signals received on the antenna 302 and which are to be demodulated are routed to a filter/amplifier stage 310, a function of which is to band pass filter certain frequencies of interest, amplify them and route them to an intermediate frequency 312 stage.

Signals coming through the Filter/Amplifier stage 310 are then mixed 311 with a signal provided by a synthesizer 350, which uses a reference frequency signal from TCXO 340 shown in FIG. 1. The output of the mixer 311 is at a frequency that is the difference between the received frequency (the signal received at the antenna 302 after being filtered) and the frequency from the synthesizer 350 into the mixer 311. This signal is the intermediate frequency or IF signal and is usually further amplified and may be mixed again down to a lower frequency before being demodulated or detected in a detector/demodulator 314, amplified in an amplifier 316 and output to a speaker 318 or other type of user interface.

Output from a user interface such as microphone 326 is presented to a modulator 324, which might be AM, FM or a single side band modulator or other sort of modulator, the output of which is used to modify a transmitted RF signal to contain the information from the user interface 326. Another output of synthesizer 350, which uses TCXO 340 as a reference, is utilized as the exciter frequency for the transmitter portions (preamp 322 and final amp 320) of the transceiver 300. In appropriate applications, the TCXO 340 output is optionally used as a reference for synthesizers 350 operating at many different frequencies.

The output of the preamp stage 322 is typically amplified in level by an amplifier section 320 and then coupled into duplexer 304 for transmission by the antenna 302.

By mounting the integrated circuitry of a TCXO on a carrier layer having an included cavity, as shown in FIG. 1, integrated circuit substrate breakage is significantly reduced. By improving the manufacturability of the TCXO using the structure shown in FIG. 1, a more reliable radio having a reduced-size TCXO results.

While the embodiment of the housing of the package shown in FIG. 1 is ceramic, alternate embodiments could certainly include glass, or thermal plastic material. The TCXO shown in FIG. 1 is fabricated using a process that includes forming several different layers each of which has substantially planar upper and lower or first and second sides, at least one of which has a cavity to accept a quartz crystal resonator and a second of which has a cavity to accept integrated circuit components. By appropriately bonding the various layers together, and by including appropriate output terminals, a multi-layer ceramic package for a TCXO reduces breakage and therefore failure rate of included components, thereby increasing yields significantly as well as the reliability of the device in a communications device such as that shown in FIG. 3.

The TCXO shown in FIG. 1 is fabricated by forming at least one of the layers of the package to have a cavity at least partially through the IC carrier layer. Alternate, and equivalent, methods would include machining a cavity into a planar layer. A quartz resonator layer is also formed to include a cavity into which a quartz crystal can be mounted with intervening layers being formed to mate with each other and be bonded or sintered to form a hermetically sealed package.

Figure 4:
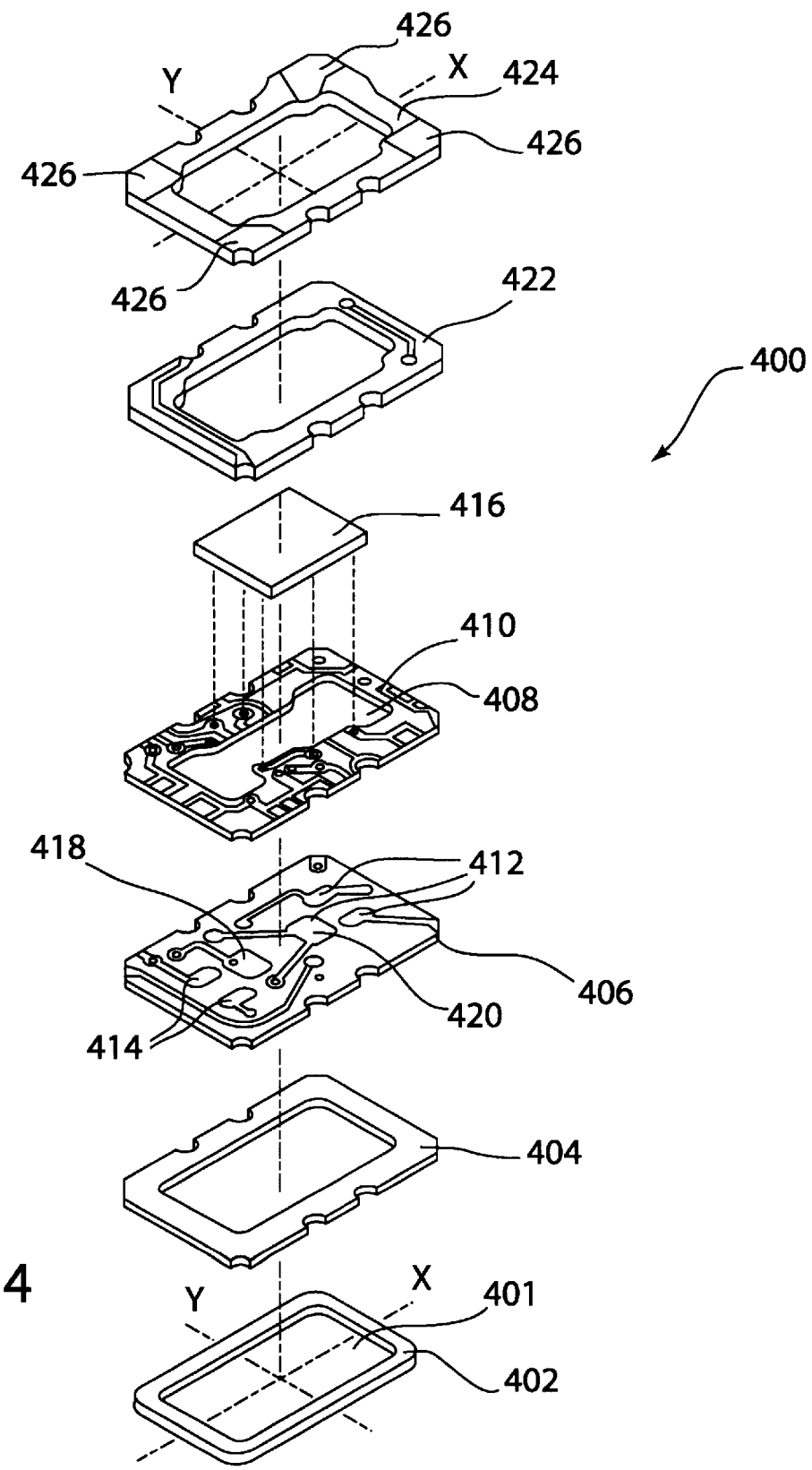
FIG. 4 shows an isometric view of the multi-layer TCXO of the preferred embodiment.

FIG. 4 shows an exploded isometric view of a preferred embodiment, which is a five-layer TCXO package 400. A crystal cavity 401 is formed by a braze ring 402 and the first ceramic layer 404. A lid (not shown) is seam welded to the "bottom" of the braze ring 402, sealing the crystal, after the crystal is mounted and tuned to its desired frequency.

Ceramic layer 406 forms a seal between the crystal cavity 401 formed by the braze ring 402 and the first ceramic layer 404 and an IC cavity 408, which is formed in ceramic layer 410. Discrete capacitors (not shown) are fastened to mounting pads at 412, 414 on ceramic layer 406 to block DC and filter noise.

The IC 416 is mounted to ceramic layer 410. Ceramic layers 410, 421, and 422 when mounted on ceramic layer 406 form a cavity which is filled with an epoxy type of non-conductive material after the IC 416 and capacitors have been installed. Contact pads 418 and 420 near the center of layer 406 provide tuning contact surfaces to the crystal enclosed by the layers 402, 404 below, used in the tuning process. These contact pads are preferably located away from the IC 416.

In a preferred embodiment, the method of fabricating a TXCO using package 400 FIG. 4 includes the following: A double-sided, multilayer ceramic TCXO package 400 is provided. Package 400 includes multiple ceramic layers 404, 406, 410, 422 and 424. A quartz crystal is placed in the bottom receptacle defined by layers 406 and 404 while the package is facing upwardly and is suitably attached to the central bottom facing portion of portion of layer 406. The quartz crystal is frequency tuned by mass adjustment (e.g. loading) of the crystal while actuating the quartz crystal through the metal tuning pads 418 and 420 on the other, IC side of layer 406. The crystal is then hermetically sealed with a metal cover (not shown) by utilizing brazing ring 402. The crystal portion of the fabrication process is now complete.

The electronic components are next mounted in the open-top receptacle which is defined by layers 406, 410, 422 and 424. Specifically, an IC 416 providing temperature compensating functions is mounted to pads on layer 410 and discrete capacitors (not shown) are mounted on layer 406 within cavity 408. An underfill is preferably dispensed such that it flows underneath the IC 416 and substantially environmentally protects the IC 416.

Thereafter, the TCXO package 400 is sent for final electrical set up and testing. Thereafter, a TCXO application user will typically solder reflow the upward facing portion of layer 424 to a circuit board suitably connecting each of the surface mount contacts 426.

Advantageously, the final tuning of the quartz crystal can be accomplished without the IC encumbering this operation. The electrical tuning pads connected to the crystal are located on the opposite side of the crystal chamber, which is advantageous during the final tuning operation.

An important feature of this invention is that the crystal tuning contacts of the double sided package are situated one ceramic layer removed from the IC. This spacing or offset provided by the IC carrier layer reduces undesired stray coupling which might be generated between RF signals processed in the IC and the crystal tuning contacts.

The TCXO disclosed herein certainly finds application in a variety of communications devices including cellular telephone equipment, such as cellular telephones, and pagers. Alternate uses of the TCXO would certainly include data processing equipment such as computers, which may require a highly-stable reference clock in a small foot-print package.

We claim:

1. A temperature compensated crystal oscillator (TCXO) providing at least one, substantially constant-frequency output signal comprising:

a housing formed from a plurality of discrete layers, said housing having at least a circuit carrier layer, said circuit carrier layer having first and second sides, a predetermined thickness and an included circuit cavity formed in said circuit carrier layer, said included circuit cavity being formed in said circuit carrier layer, to extend through at least said first side toward said second side and of a sufficient depth and area so as to be able to accommodate a substantially planar integrated circuit attached to said first side of said carrier layer.

2. The TCXO of claim 1 further comprised of:

an integrated circuit having a substantially planar back side and a front side said integrated circuit being mounted to said circuit carrier layer and at least one electrical connecting pad on the front of the said integrated circuit corresponding to at least one connecting pad on the top surface of said circuit carrier layer.

3. The TCXO of claim 1 further comprised of:

a plurality of contact pads, each consisting of connective material with which to fasten the said integrated circuit to the said circuit carrier layer.

4. The TCXO of claim 1, wherein said plurality of discrete layers are substantially planar.

5. The TCXO of claim 2 wherein said integrated circuit includes circuitry which provides a compensation signal to other TCXO circuitry, which acts to maintain the TCXO output signal substantially constant over a range of temperatures.

6. The TCXO of claim 2 wherein further including a quartz crystal resonator device, operatively coupled to circuitry within said integrated circuit.

7. The TCXO of claim 1 wherein at least one of said layers is comprised of a ceramic material.

8. The TCXO of claim 1 wherein at least one of said layers is comprised of a thermoplastic material.

9. The TCXO of claim 1 wherein at least one of said layers is comprised of glass.

10. The TCXO of claim 1 wherein at least one of said layers is comprised of metallic material.

11. The TCXO of claim 10 wherein at least one of said crystal cavity layer, said integrated circuit carrier layer and said tuning layer and said cover layer is comprised of a non-ceramic material.

12. A temperature compensated crystal oscillator (TCXO) comprising:

a housing formed from a plurality of discrete functional layers comprised of:

a crystal cavity layer having a first side and a second side and an included cavity for receiving a resonator device;

a crystal mounting layer having a first side and a second side attached to the first side of said crystal cavity layer;

an integrated circuit carrier layer having a first and a second side attached to the first side of said tuning capacitor layer and further including a cavity formed through said first side and extending into said carrier layer substantially through said carrier layer;

an integrated circuit attached to said first side of said integrated circuit carrier layer and substantially over said cavity formed through said first side;

a cover layer formed to substantially conform to the first side of said integrated circuit carrier layer and said integrated circuit so as to substantially seal said integrated circuit.

13. A radio communications device comprised of:

a frequency-selective radio device that is capable of receiving and demodulating radio frequency signals according to a reference frequency signal input to said frequency-selective radio device;

a temperature compensated crystal oscillator (TCXO), said TCXO having an output port from which reference frequency signals are emitted and which is operatively coupled to said frequency-selective radio device so as to supply a reference frequency signal to said frequency-selective radio device, said TCXO comprised of:

a housing formed from a plurality of discrete layers, said housing having at least a circuit carrier layer, said circuit carrier layer having first and second sides, a predetermined thickness and an included circuit cavity formed in said circuit carrier layer, said included circuit cavity being formed in said circuit carrier layer, to extend through at least said first side toward said second side.

14. The radio communications device of claim 13 wherein said frequency-selective radio device is a cellular telephone.

15. The radio communications device of claim 13 wherein said frequency-selective radio device is a pager.

16. The radio communications device of claim 13 wherein said frequency-selective radio device is a personal digital assistant.

17. The radio communications device of claim 13 wherein said frequency-selective radio device is a two-way radio.

18. The radio communications device of claim 13 wherein said frequency-selective radio device is a radio transmitter.

19. The radio communications device of claim 13 wherein said frequency-selective radio device is a base station for a wireless communications system.

20. A method of manufacturing a temperature compensated crystal oscillator (TCXO) comprising the steps of:

forming a housing from a plurality of separate layers, including: a first layer having a cavity to accept therein a crystal resonator; an integrated circuit carrier layer having a first side and a second side and a cavity formed in said integrated circuit carrier layer to extend at least through said first side and sized to accept in said cavity in said carrier layer, at least a portion of an integrated circuit that includes circuitry to control at least the frequency of signals output from said TCXO on an output terminal.

* * * * *